(12) United States Patent
Hu (10) Patent No.: US 7,757,193 B2
(45) Date of Patent: Jul. 13, 2010

(54) STRUCTURE CLUSTER AND METHOD IN PROGRAMMABLE LOGIC CIRCUIT

(75) Inventor: Bo Hu, San Jose, CA (US)

(73) Assignee: Agate Logic, Inc., Cupertino, CA (US)

( * ) Notice: Subject to any disclaimer, the term of this patent is extended or adjusted under 35 U.S.C. 154(b) by 0 days.

(21) Appl. No.: 11/537,744

(22) Filed: Oct. 2, 2006

(65) Prior Publication Data

US 2008/0082951 A1 Apr. 3, 2008

(51) Int. Cl.
G06F 9/45 (2006.01)
G06F 17/50 (2006.01)

(52) U.S. Cl. .................. 716/6; 716/4; 716/5; 716/8; 716/16; 703/19

(58) Field of Classification Search .............. 716/4–6, 716/7–14, 15–17; 703/19
See application file for complete search history.

(56) References Cited

U.S. PATENT DOCUMENTS

| | | | | |
|---|---|---|---|---|
| 4,941,094 A * | 7/1990 | Satta et al. | .............. | 382/132 |
| 5,818,726 A * | 10/1998 | Lee | .............. | 716/10 |
| 6,609,228 B1 * | 8/2003 | Bergeron et al. | .............. | 716/2 |
| 6,727,726 B1 | 4/2004 | Plants | | |
| 6,847,993 B1 | 1/2005 | Novaes et al. | | |
| 2003/0064559 A1 * | 4/2003 | Teig et al. | .............. | 438/218 |
| 2004/0088663 A1 * | 5/2004 | Wu et al. | .............. | 716/6 |
| 2007/0022399 A1 * | 1/2007 | Tsai et al. | .............. | 716/11 |
| 2008/0077898 A1 * | 3/2008 | Subasic et al. | .............. | 716/9 |

OTHER PUBLICATIONS ("Performance-Oriented Placement and Routing for Field-Programmable Gate Arrays", by Michael J. Alexander, James P. Cohoon, Joseph L. Ganley, and Gabriel Robins, by Proceedings of the European design Automation Conference @ 1995.*

* cited by examiner

Primary Examiner—Paul Dinh
Assistant Examiner—Nha T Nguyen
(74) Attorney, Agent, or Firm—Radlo & Su LLP (57) ABSTRACT

A method for clustering logic units in a field programmable integrated chip to generate a set of clusters is disclosed. The clustering step for forming a super cluster comprises a first logic element and a second logic unit a first logic unit and a super cluster, or a first super cluster and a second super cluster. The method includes generating all possible configurations by enumerating all possible two-way relationships combining a driver-and-receiver relationship from a pool of a finite number of dedicated connections. The set of all possible configurations is reduced to a subset of configurations based on one or more multi-dimension criteria. Each dimension in the multi-dimensional criteria is represented by a parameter. The method involves prioritizing a collection of parameters so that a set of selected parameters or a set of selected criteria is used to generate a desirable number of subsets of configurations.

23 Claims, 7 Drawing Sheets

STRUCTURE CLUSTER AND METHOD IN PROGRAMMABLE LOGIC CIRCUIT

COPYRIGHT NOTICE

A portion of the disclosure of this patent document contains material that is subject to copyright protection. The copyright owner has no objection to the reproduction of the patent document or the patent disclosure in exactly the form it appears in the Patent and Trademark Office patent file or records, but otherwise reserves all copyright rights whatsoever.

BACKGROUND OF THE INVENTION

1. Field of the Invention

The present invention relates generally to programmable chips, and more particularly to clustering of programmable elements in field programmable integrated circuits (ICs).

2. Description of Related Art

Field programmable gate arrays (FPGAs) are often selected by designers to provide a flexible approach to the programming and re-programming of integrated circuits, in order to accommodate a system specification, correct errors in the system, or make improvements to the system by reprogramming of the field programmable gate array. One conventional field programmable gate array architecture is implemented using groups of look-up tables and programmable interconnect circuits. While the look-up tables and sequential elements are connected to each other, the connections to the groups of look-up tables typically originate from a switchbox located in each group of the look-up table. A hierarchical interconnect structure connects to elements in a look-up table through a switchbox, thereby serving as the primary source of connecting look-up tables from one logic block to another logic block. The inputs to the look-up tables are therefore generated primarily from the switch box. The look-up table outputs are directly fed to other look-up tables as well as the elements within the look-up tables, but the connections to other look-up tables' inputs are made through the switch box.

Although field programmable gate arrays enable user programming of integrated circuits, these integrated circuits typically produce slower performance (clock speed) because of the delays through the transistors, switches or multiplexers used to program the interconnects between configurable logic elements. Each logic element can be connected to a multitude of other logic elements through switches in which the path from one programmable logic element to the next may be strewn with many switches, slowing down circuit operation. Some paths in a programmable IC are not as critical as others. Therefore, a customized programmable IC can be designed such that speed in the critical paths is optimized over other non-critical paths.

Routing elements have increasingly been added to programmable logic devices/ICs so that routing elements now typically occupy a much larger area than the configurable logic elements themselves. Adding to the problem is the fact that routing delays are typically much greater than logic delays, resulting in a slow operating clock frequency. In a conventional implementation, a large fraction of the routing elements may be redundant.

As semiconductor processes advance into deep sub-micron regimes, the cost of manufacturing a complex Application-Specific Integrated-Circuit (ASIC) chip using state-of-the-art technology is sky-rocketing. As a viable solution which will reduce costs and shorten product development cycles while minimizing production risks, field programmable gate arrays have been gaining more acceptance in various applications than ever before. Traditional homogeneous field programmable gate arrays are mainly based on programmable Look-Up Tables (LUTs). The logic density and performance of traditional homogeneous filed programmable gate arrays are usually inferior to ASIC implementations.

Efforts have been mounted to improve the overall performance of field programmable gate arrays. It is desirable to have a method that improves the performance of programmable integrated circuits for use with innovative hardware solutions.

SUMMARY OF THE INVENTION

The present disclosure describes a method of clustering logic units in a design to generate a set of clusters (also referred to as "super clusters"). The clustered logic units have a critical connection between a first logic unit and a second unit, which can be implemented using a dedicated physical connection in field programmable gate array. The dedicated connection between the first and second logic units provides faster processing of signal propagation from the first logic unit to the second logic unit. The clustering step of forming a super cluster can comprise various combinations, such as a first logic element and a second logic unit, a first logic unit and a super cluster, or a first super cluster and a second super cluster.

The method involves the generation of all possible configurations by enumerating all possible two-way relationships to combine a driver-and-receiver relationship from a pool of a finite number of dedicated connections. The number of super clusters can increase exponentially from the various combinations and permutations. Therefore, the number of all possible configurations are pruned, or reduced to a subset of configurations based on one or more multi-dimension criteria. Each dimension in the multi-dimension criteria is represented by a parameter. The method includes the prioritization of a collection of parameters so that a set of selected parameters (or a set of selected criteria) is used to generate a desirable number of subsets of configurations from all possible two-way configurations.

Broadly stated, a method for structure clustering logic elements in a programmable logic integrated circuit comprises generating all possible configurations by clustering a first element and a second element to form first-element-and-second-element configurations, each first-and-second-element configuration having one or more logic connections between the first element and the second element that map to dedicated physical connections on the programmable logic integrated circuit; and reduces the total number of all possible configurations according to one or more predetermined criteria, thereby generating a subset of configurations from all possible configurations, each criterion having a set of parameters that are prioritized, each parameter having a predetermined value.

The structures and methods of the present invention are disclosed in the detailed description below. This summary does not purport to define the invention. The invention is defined by the claims. These and other embodiments, features, aspects, and advantages of the invention will become better understood with reference to the following description, appended claims and accompanying drawings.

BRIEF DESCRIPTION OF THE DRAWINGS

The invention will be described with respect to specific embodiments thereof, and reference will be made to the drawings, in which.

DETAILED DESCRIPTION

Figure 1:
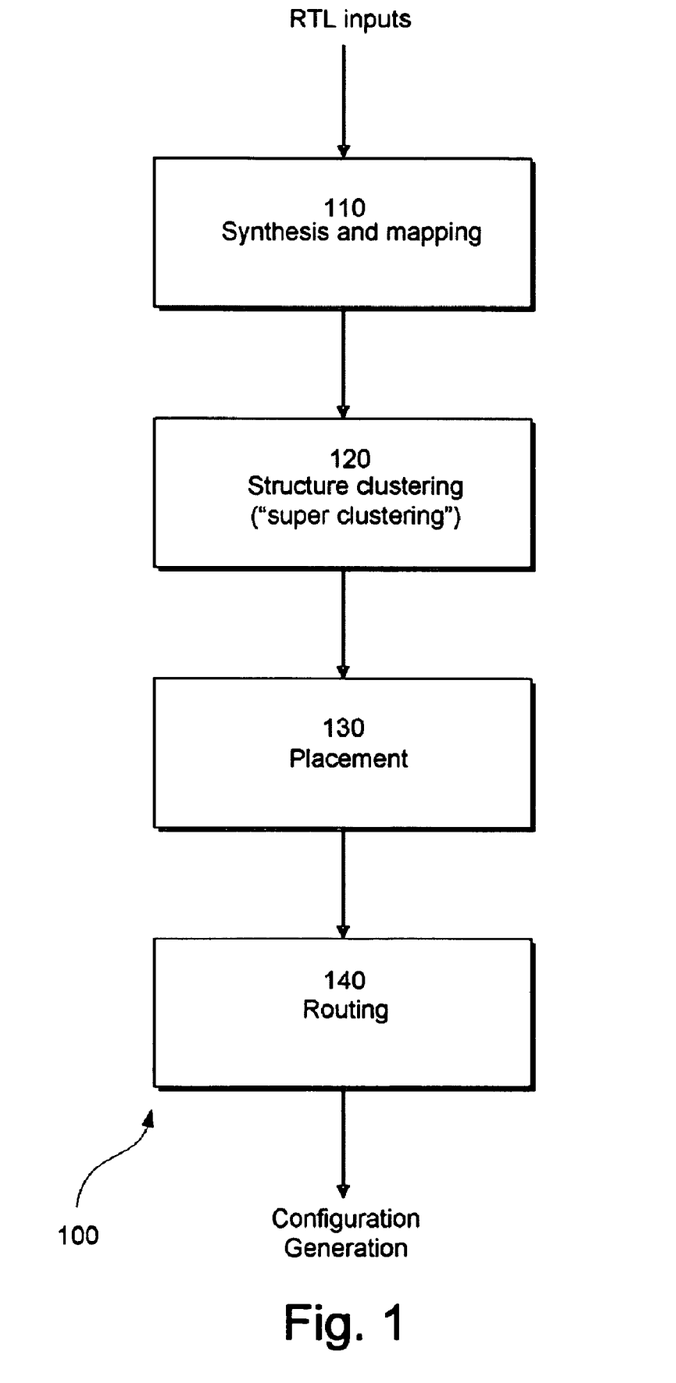
FIG. 1 is a simplified flow diagram illustrating the general process in an Electronic Design Automation flow system in accordance with the present invention.

FIG. 1 illustrates a simplified flow diagram of the general process 100 in an Electronic Design Automation (EDA) flow. At step 110, the synthesis and mapping block receives Register Transfer Logic (RTL) inputs and converts to a netlist of primitives. A primitive has a corresponding physical implementation of a logic circuit, such as an adder, a multiplexer or a look-up table. To state this in another way, a primitive represents a basic functional unit that performs a certain function, including a look-up table, an adder, an accumulator or a memory. At step 120, the structure clustering block extracts timing parameters that are critical to an integrated circuit design. The structure clustering blocks use the timing parameters to group a set of clusters (also referred to as "super clusters"). A super cluster comprises one or more primitives that have a weighed value. After super clustering, the process 100 involves the performance of place and route functions at steps 130 and 140, respectively, to generate a circuit configuration.

Figure 2:
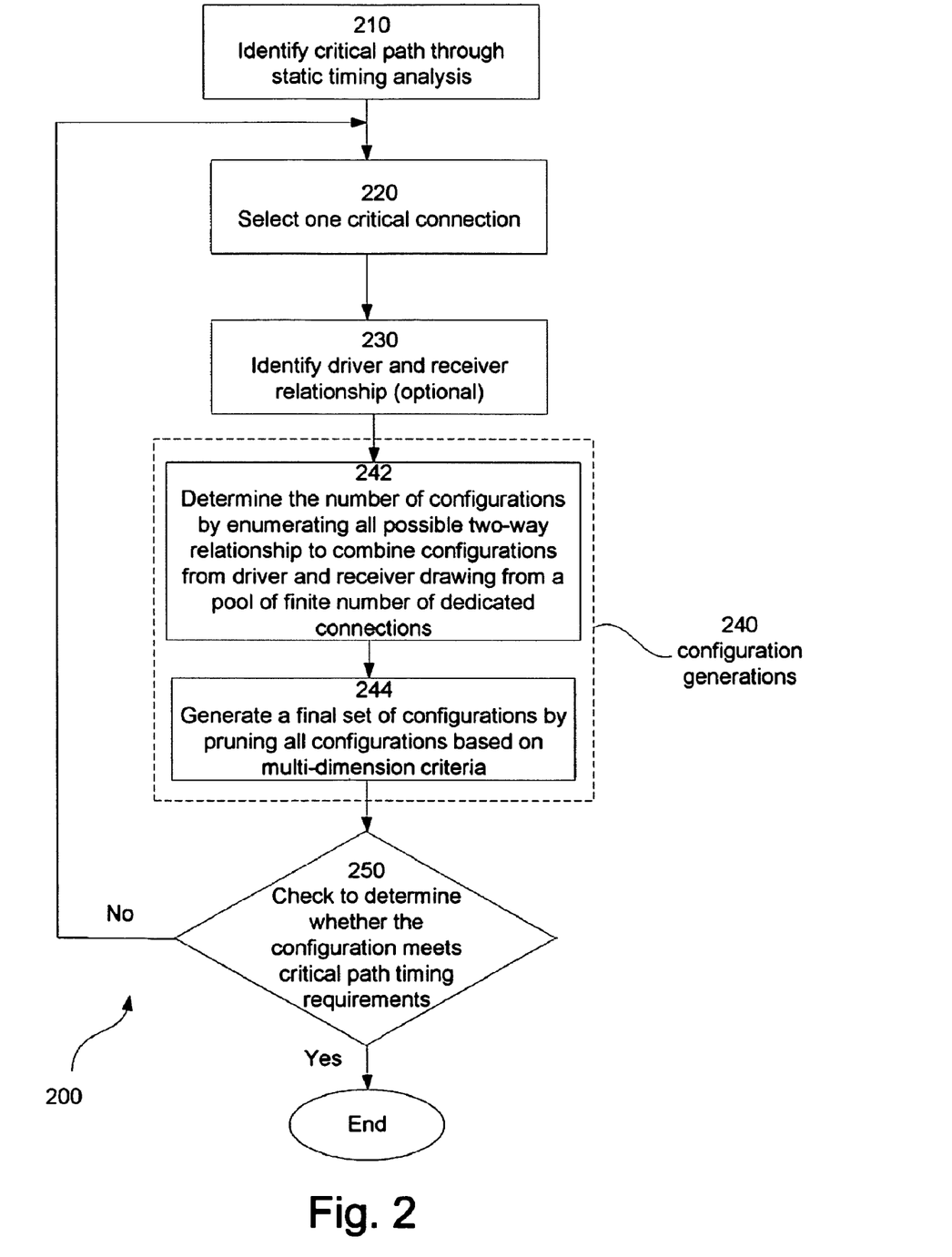
FIG. 2 illustrates a flow diagram of a method for carrying out structural clustering of circuit elements in accordance with the present invention.

FIG. 2 illustrates a flow diagram of a method 200 for carrying out structural clustering (also referred to as "super clustering") of circuit elements, also referred to as a "super cluster algorithm." A critical path represents a significant consideration in the design of a system. In one illustration of a system, the system comprises a floating point unit (FPU) connected to various logic units, such as an adder, a multiplier, a register and a look-up table. The critical path in the system, which is a principle factor in the determination of clock speed, can be optimized utilizing resources, such as dedicated connections. The super cluster algorithm operates to identify one or more critical paths in a system, and organizes the one or more critical paths so that the connections use dedicated resources to achieve fast timing and signal propagation, thereby minimizing delays.

At step 210, critical paths through static timing analysis are identified, such as through a conventional timing analysis. At step 220, one critical connection from an output of a logic (or circuit) element to an input of a logic (or circuit) element is selected. A connection is defined as a point-to-point connection between logic elements, units, or logic units. A critical connection is a connection along a path that is determined to be a critical path. The term "critical path" can be defined in various ways by a circuit designer, such as a path with the most negative slack, or a path with the slack less than a predetermined value. In an optional step, a driver-and-receiver relationship between two logic elements or units is determined at step 230. For example, a floating point unit may serve as a driver to an adder, in which case the adder may serve as a receiver. Sample orientations of driver-receiver relationships are further described with respect to FIGS. 3A-3E.

At step 240, a plurality of configurations are generated wherein each configuration comprises one or more structural clusters. The step 240 is largely divided into two process sequences at steps 242 and 244. At step 242, the number of configurations is determined by enumerating all possible two-way relationships to combine configurations of a driver and a receiver by drawing from a pool of a finite number of dedicated resources. For example, two elements include a floating point unit (which serves as a driver) and an adder (which serves as a receiver) which are grouped into a structural cluster (or super cluster) to generate a configuration. The floating point unit and an adder are positioned in a driver-and-receiver relationship, connected by a dedicated line, and are able to generate several different configurations, as illustrated in FIGS. 3A-3E. The term "dedicated resources" refers to a dedicated line connecting to a circuit element, a dedicated connection between two logic units, a dedicated circuit element, or other type of dedicated resource. For additional information on dedicated resources, see U.S. patent application Ser. No. 11/036,109 entitled "Programmable Logic and Routing Blocks with Dedicated Lines," filed on 14 Jan. 2005, U.S. patent application Ser. No. 11/044,386 entitled "Programmable Logic Cells with Local Connections," filed on 27 Jan. 2005, U.S. patent application Ser. No. 11/066,336 entitled "Dedicated Logic Cells Employing Configurable Logic and Dedicated Logic Functions," filed on 23 Feb. 2005, and U.S. patent application Ser. No. 11/065,019 entitled "Dedicated Logic Cells Employing Sequential Logic and Control Logic Functions," filed on 23 Jan. 2005, which are all owned by the assignee of this application and incorporated by reference as if fully set forth herein.

Figure 3A:
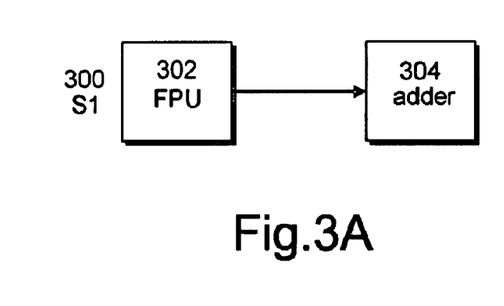
FIGS. 3A-3E are structural diagrams illustrating the various orientations of a driver-receiver relationship in accordance with the present invention.
Figure 3B:
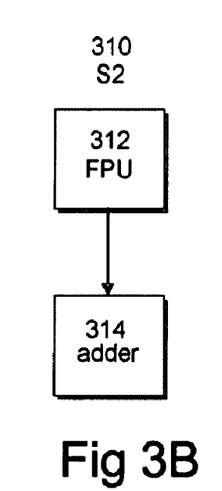
Figure 3C:
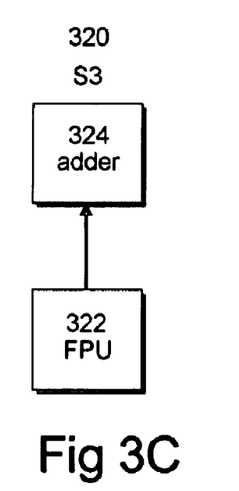
Figure 3D:
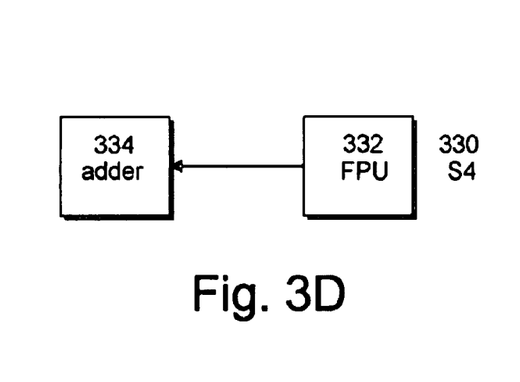
Figure 3E:
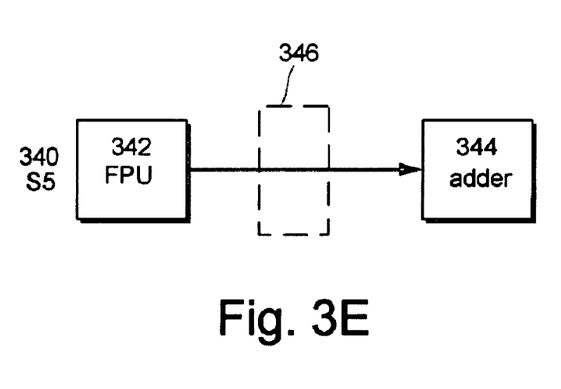

FIGS. 3A-3E are structural diagrams illustrating the various orientations of a super cluster constructed. A super cluster comprises a set of shapes wherein each shape has a particular organization of primitives. In these simplified illustrations, each super cluster comprises two primitives in a driver-receiver relationship. In a first super cluster S1 300 as illustrated in FIG. 3A, a first primitive 302, such as the floating point unit, drives a second primitive 304, such as the adder, in a horizontal direction from west to east. In a second super cluster S2 310, a second primitive 314 drives a first primitive 312 in a vertical downward direction from north to south. In a third super cluster S3 320, a second primitive 324 drives a first primitive 322 in a vertical upward direction from south bound to north bound. In a fourth super cluster S4 330, a first primitive 332 drives a second primitive 334 in a horizontal direction from east bound to west bound. In a fifth super cluster S5 340, one or more logic elements 346 are inserted between a first primitive 342 and a second primitive 344. The same principles of inserting one or more logic elements in the fifth super cluster S5 340 are also applicable to the different orientations as described in the first, second, third, and fourth super clusters S1 300, S2 310, S3 320 and 54 330. Each of the super clusters S1 300, S2 310, S3 320, S4 330, S5 330, and S4 340 represents a different geometric set. Even though each set possesses the same primitives, the relative positions of the primitives are at different locations.

A configuration is defined as an optimized physical implementation of a target connection based on one or more criteria. Each configuration is generated according to a certain criterion or matrix. For example, one criterion may be to minimize the height of a physical size by selecting a signal that flows from west to east so as to minimize the height of the driver-and-receiver structure.

A super cluster is a relative term that means that two or more elements, one element and one super cluster, or two or more super clusters, or any other combination or permutation that can be grouped to form one super cluster. Therefore, as a first super cluster is formed, the first super cluster can be combined with another element to form a second super cluster. Or, the first super cluster can be combined with a third super cluster to form a fourth super cluster. Or, the first super cluster can be combined with the fifth super cluster as well as a sixth super cluster, or additional super clusters for that matter, to form a seventh super cluster. As an example of the basic super clustering of two elements, FIGS. 3A-3E illustrates five different configurations or orientations of super clusters.

Figure 4A:
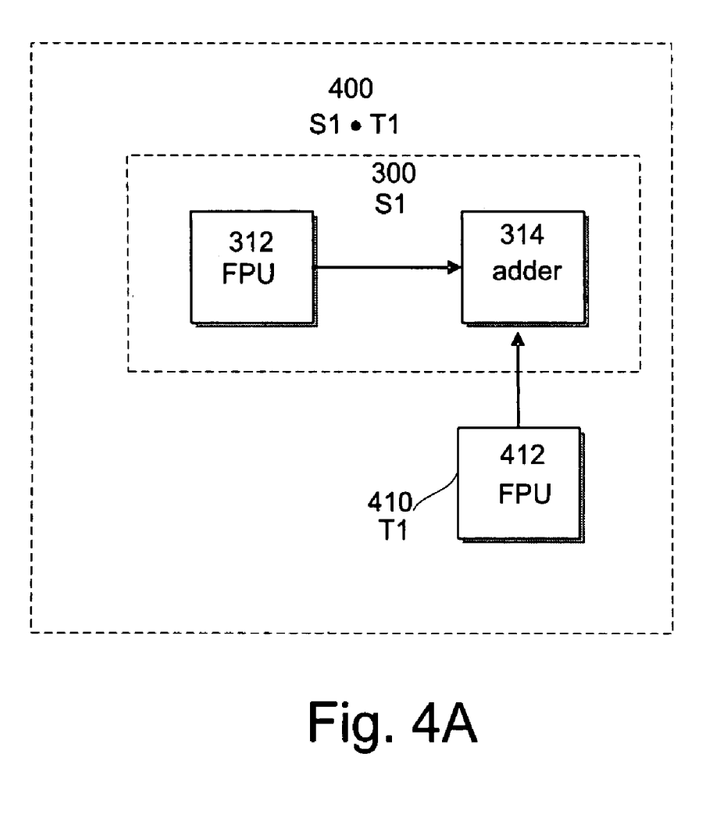
FIGS. 4A-4B are structural diagrams illustrating additional super clustering by clustering an element with a super cluster to form a new super cluster in accordance with the present invention.
Figure 4B:
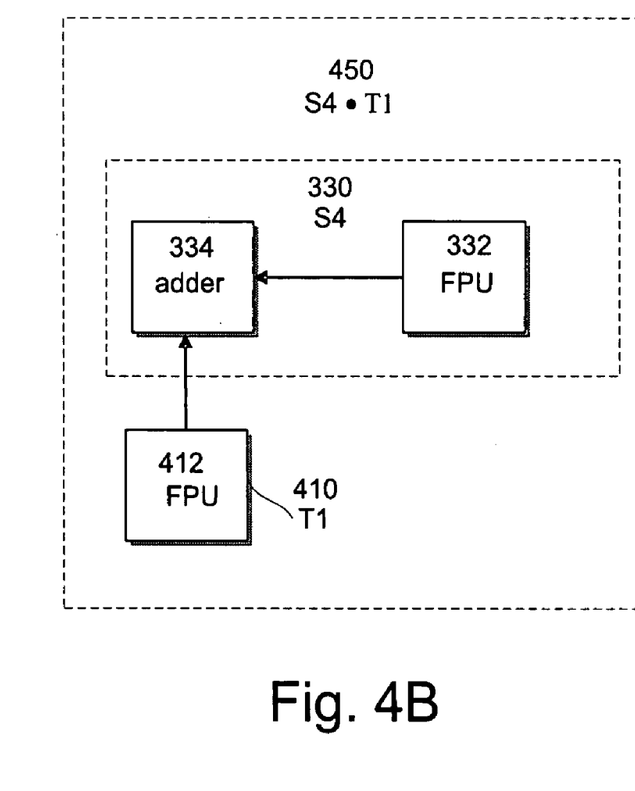

An example of another method super clustering is, an element T1 410 comprises an FPU 412 combined with the super cluster S1 310 to form a super cluster 400, represented as S1●T1 in FIG. 4A. Another variation is to combine the element T1 410 with the super cluster 54 330 to form a super cluster 450, represented as S4●T1 in FIG. 4B.

Figure 5:
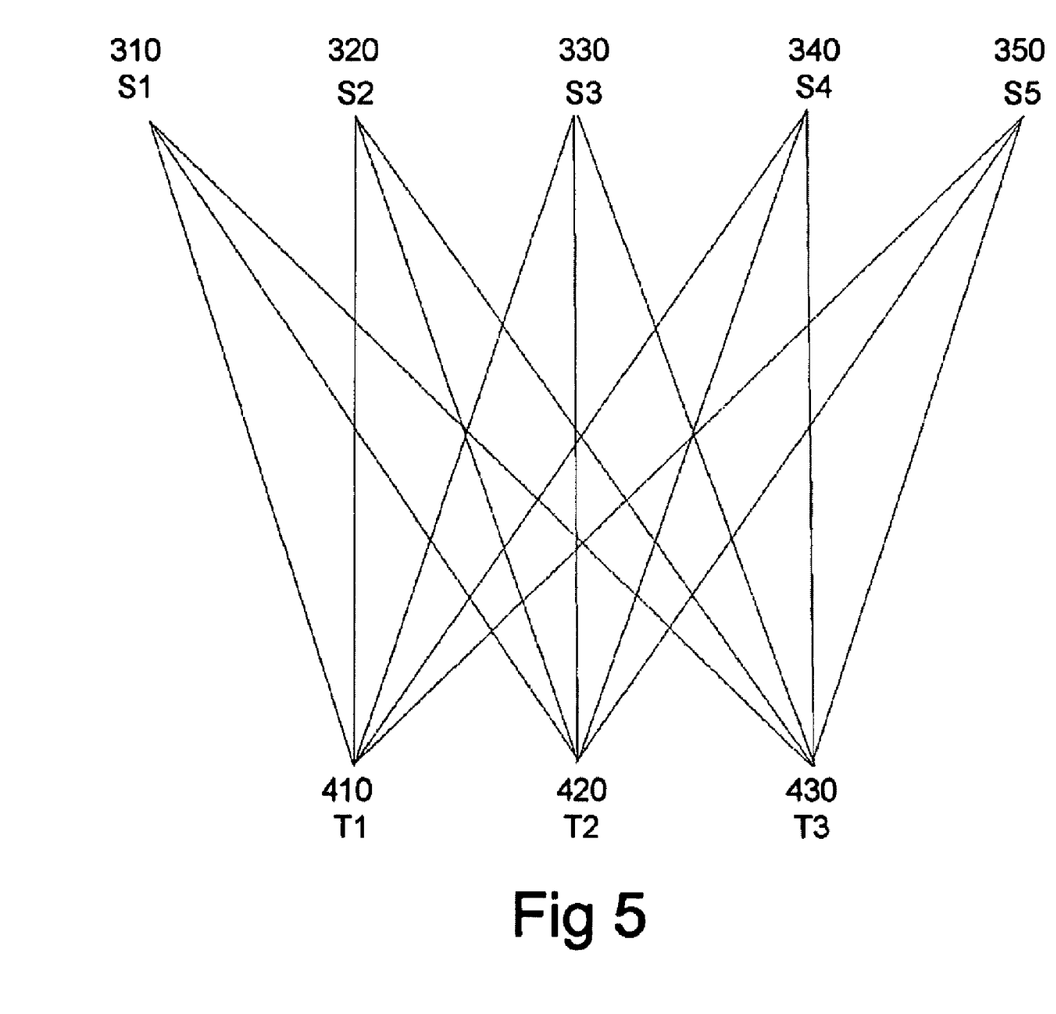
FIG. 5 is a structural diagram illustrating cross enumeration of a plurality of elements with a plurality of super clusters in accordance with the present invention.

A further example of super clustering, involves having elements T1 410, T2 420 and T3 430 super clustered with super clusters S1 310, S2 320, S3 330, S4 340 and S5 350. Different combinations are cross enumerated between the elements T1 410, T2 420 and T3 430 with super clusters S1 310, S2 320, S3 330, S4 340 and S5 350, as shown in FIG. 5. The number of new possible configurations generated from the cross enumeration in the embodiment is 15 (3×5=15), where the element T1 410 is combined with S1 310, S2 320, S3 330, S4 340, S5 350, where the element T2 420 is combined with S1 310, S2 320, S3 330, S4 340, S5 350, and where T3 430 is combined with S1 310, S2 320, S3 330, S4 340, S5 350.

After all possible configurations have been generated, at step 254, the total number of configurations is reduced by pruning all possible configurations based on one or more multi-dimensional criteria. All configurations generated at step 254 are subject to pruning based on the selected criteria in order select a subset of configurations from all possible configurations. The pruning step is typically a necessary step in order to manage exponential growth in super clustering given that there is a limitation in memory capacity. Pruning is conducted by defining a set of criteria and based on each criterion, select a certain number of configurations that fit that selected criterion or criteria. One exemplary criterion may be that the signal has to flow from a right side to a left side while minimizing the height logic elements. Another exemplary criterion may be that the signal has to flow from east to west while maximizing the height, minimizing the width, or minimizing the area. The term "multi-dimensional criteria or matrix" refers to selecting a set of configurations from all possible configurations based one criteria which considers multiple parameters simultaneously, so that the selected set of configurations optimizes those parameters in a prioritized way.

Figure 6:
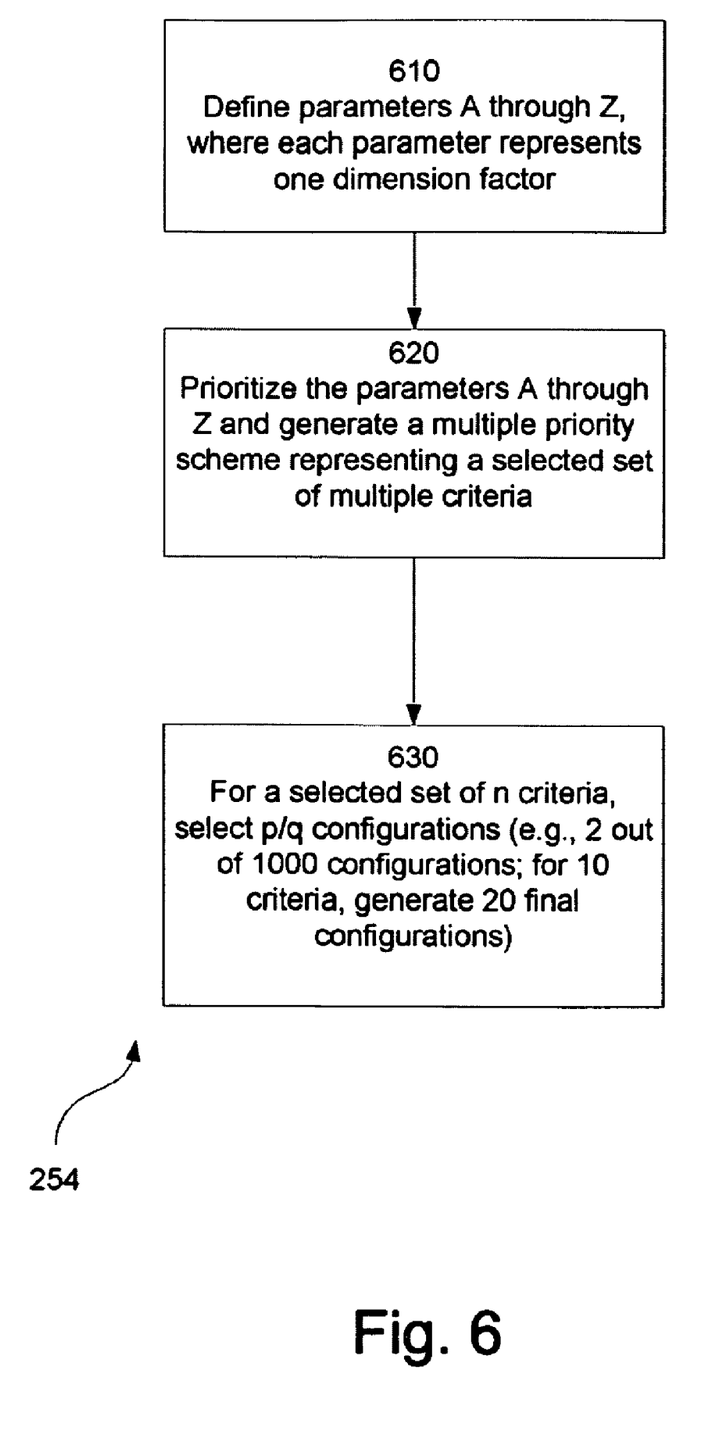
FIG. 6 is a flow diagram illustrating the process for pruning all possible configurations into a subset of configurations in accordance with the present invention.

The pruning process at step 252 is further elaborated in FIG. 6. At step 610, parameters A through Z are defined, wherein each parameter represents one dimension factor. At step 620, the parameters A through Z are prioritized in order to generate multiple priority schemes representing a selected set of criteria. At step 630, for each criterion in the selected set of n criteria, p/q configurations are selected, e.g. 2 out of 1,000 configurations. In other words, one criterion produces two configurations. For 10 criteria, for example, the method 200 generates 20 final configurations.

At step 250, the newly generated configuration or configurations from the step 240 are checked to determine whether they meet the critical path timing requirements. If the newly generated configurations do not meet the critical path timing requirement, the method 200 loops back to the step 220 to select another critical connection along the critical path to process. If the newly generated configuration does meet the critical path timing requirements, the method 200 exits as an indication that a super clustering process has been completed.

In one embodiment of the invention, the method 200 is implemented by the following software codes:

```
1.  Initialize supercluster for each primative
2.  do until (no merge is possible) {
      identify critical connections;
      for each connection, (once identify the connection, which driver and
      receiver)
        get driving supercluter Scd
        get receiving SC SCr
        generate all shapes for SC new by merging Scd and Scr
        shape pruning based on multi-dimensional metric
        timing analysis - update delays for connections; once get SC new,
        update
    the timing of the design (once merge C1 and C2, into C3, the timing
    will be different) (have connections internal and external, once merged, all
    connections are internal).
      } end of for loop
    } end of do loop
```

Figure 7:
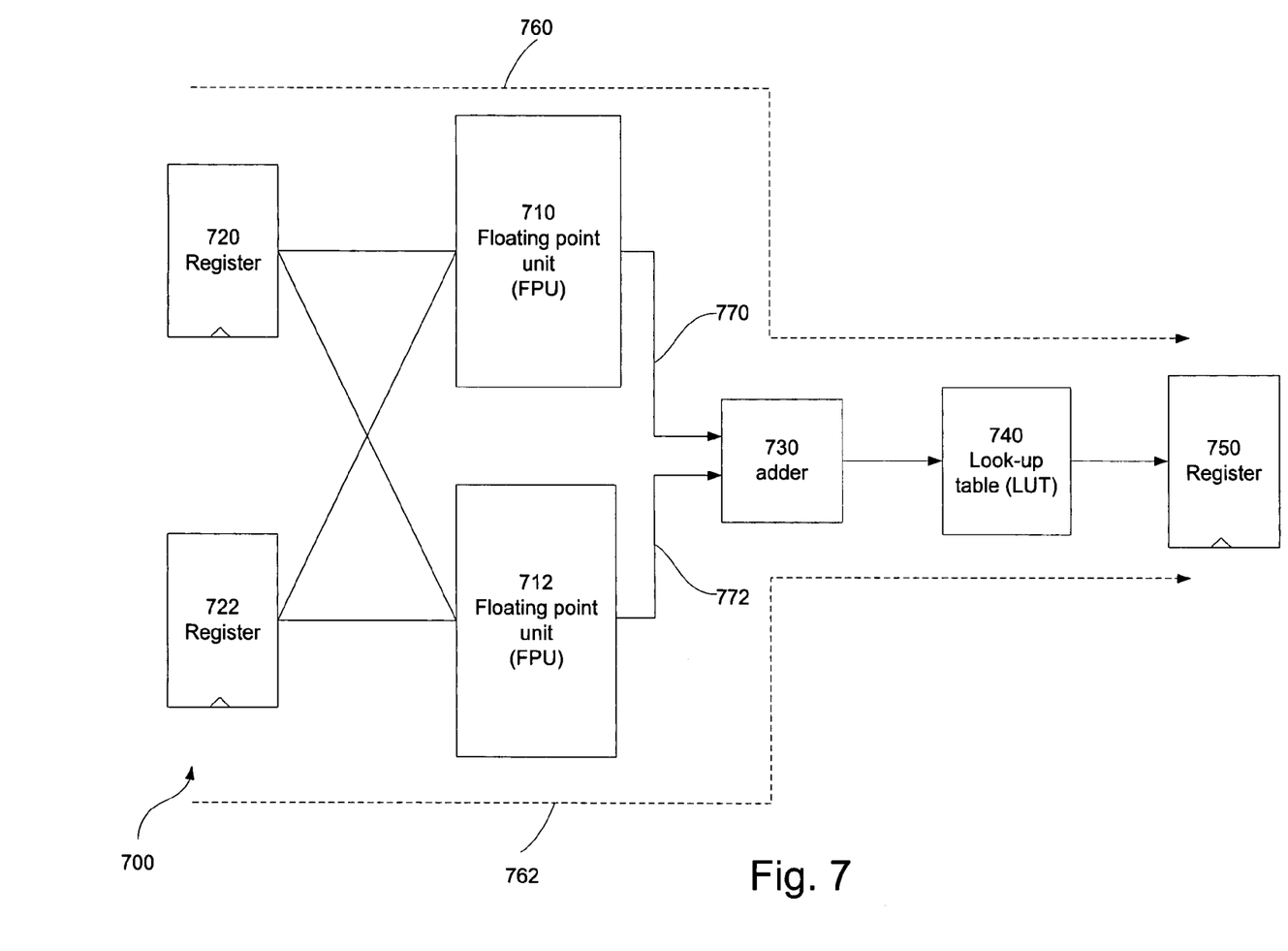
FIG. 7 is a system diagram illustrating, for an integrated circuit chip, dedicated connections between cells along critical paths in accordance with the present invention.

FIG. 7 is a system diagram of an integrated circuit 700 illustrating critical paths with selected dedicated connections between cells. The integrated circuit 700 includes a first floating point unit 710 having an input coupled to a register 720 and an output coupled to an adder 730, and a second floating point unit 712 having an input coupled to a register 722 and an output coupled to the adder 730. The adder 730 is further coupled to a look-up table 740 which in turn is coupled to a register 750. A first critical path 760 is identified from the register 720, the floating point unit 710, the adder 730, the look-up table 740, to the register 750. A second critical path 762 is identified from the register 722, the floating point unit 712, the adder 730, the look-up table 740, to the register 750. A first dedicated connection 770 connects between the first floating point unit 710 and the adder 730 along a first critical path 760. A second dedicated connection 772 connects between the second floating point unit 712 and the adder 730 along a second critical path 762.

The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive, the invention is defined by the following appended claims.

I claim:

1. A method for clustering logic elements in a programmable logic integrated circuit, comprising:
    initializing each logic element in a structural cluster of the programmable logic integrated circuit, the structural cluster including a first logic element and a second logic element;
    identifying a critical path between the first logic element and the second logic element;
    generating a plurality of configurations by an Electronic Design Automation (EDA) tool for clustering the first element and the second element to form first-element-and-second-element configurations for the selected critical path, the plurality of configurations being generated based on a plurality of horizontal and vertical orientations of the first element relative to the second element, each first-and-second-element configuration having a logic connection between the first element and the second element that maps to a dedicated point-to-point connection on the programmable logic integrated circuit;

wherein the clustering of the first element and the second element comprises clustering a first cluster and a second cluster, respectively, to form cluster-and-cluster configurations, each cluster-and-cluster cluster having a logic connection between the first cluster and the second cluster that maps to a dedicated connection on the programmable logic integrated circuit;

reducing the number of the plurality of configurations by the EDA tool according to one or more predetermined multi-dimensional criteria, thereby generating a subset of configurations from the plurality of configurations, each criterion having a set of parameters that are prioritized, each parameter having a predetermined value; and determining whether the subset of configurations meets a critical path timing requirement.

2. The method of claim 1, wherein the clustering of the first element and the second element comprises clustering a driver and a receiver respectively to form driver-and-receiver configurations, each driver-and-receiver cluster having a logic connection between the driver and the receiver that maps to a dedicated physical connection on the programmable logic integrated circuit.

3. The method of claim 1, wherein the clustering of the first element and the second element comprises clustering a logic element and a cluster, respectively, to form logic-and-cluster configurations, each logic-and-cluster cluster having a logic connection between the logic element and the cluster that maps to a dedicated physical connection on the programmable logic integrated circuit.

4. The method of claim 3, wherein the cluster comprises a first logic unit and a second logic unit.

5. The method of claim 1, wherein the first cluster comprises at least two logic units, and the second cluster comprises at least two logic units.

6. The method of claim 1, wherein the reducing step comprises defining a set of parameters such that each parameter represents one dimension factor.

7. The method of claim 6, wherein the reducing step comprises prioritizing the set of parameters to generate a priority scheme for the set of parameters, each priority scheme producing a criterion.

8. The method of claim 7, wherein the reducing step comprises generating the subset of configurations from the plurality of configurations according to the one or more predetermined criteria.

9. The method of claim 6, wherein the subset of configurations are generated based on the priority scheme for a selected set of parameters.

10. The method of claim 1, wherein the one or more predetermined criteria comprises a first criterion that minimizes the heights of the driver and receiver.

11. The method of claim 1, wherein the one or more predetermined criteria comprises a second criterion that minimizes the widths of the driver and receiver.

12. The method of claim 1, wherein the one or more predetermined criteria comprises a third criterion that minimizes the areas of the driver and receiver.

13. The method of claim 12, prior to the identifying step, further comprising selecting a critical connection that connects from an output of the first element to an input of the second element.

14. The method of claim 1, prior to the generating step, further comprising identifying the first element and the second element relationship including the plurality of horizontal and vertical orientations formed from the first element and the second element.

15. The method of claim 1, wherein the plurality of orientations comprise an orientation in which the first element drives the second element in a horizontal direction from west to east.

16. The method of claim 1, wherein the plurality of configurations comprise an orientation in which the first element drives the second element in a horizontal direction from east to west.

17. The method of claim 1, wherein the plurality of configurations comprise an orientation in which the first element drives the second element in a vertical downward direction from north to south.

18. The method of claim 1, wherein the plurality of configurations comprise an orientation in which the first element drives the second element in a vertical upward direction from south to north.

19. The method of claim 1, wherein the first element comprises a floating point unit and a second element comprises a logic unit.

20. The method of claim 1, wherein the first element comprises a driver and a second element comprises a receiver.

21. The method of claim 1, wherein the first element comprises a receiver and a second element comprises a driver.

22. The method of claim 1, wherein the first element comprises a floating point unit and the second element comprises an adder.

23. A method for clustering logic elements in a programmable logic integrated circuit, comprising:

initializing each logic element in a first structural cluster of the programmable logic integrated circuit, the first structural cluster including a first logic element and a second logic element;

identifying a first critical path between the first logic element and the second logic element in the first structural cluster;

generating a plurality of configurations by an Electronic Design Automation (EDA) tool for clustering the first element and the second element by the EDA tool to form the first structural cluster for the first selected critical path, the first plurality of configurations being generated based on a plurality of horizontal and vertical orientations of the first element relative to the second element, each first-and-second-element configuration having a logic connection between the first element and the second element that maps to a dedicated point-to-point connection on the programmable logic integrated circuit;

reducing the number of the first plurality of configurations by the EDA tool according to one or more predetermined multi-dimensional criteria, thereby generating a subset of configurations from the plurality of configurations, each criterion having a set of parameters that are prioritized, each parameter having a predetermined value;

determining whether the subset of configurations meets a critical path timing requirement;

initializing each logic element in a second structural cluster of the programmable logic integrated circuit, the second structural cluster including a third logic element and a fourth logic element;

identifying a second critical path between the third logic element and the fourth logic element;

generating a plurality of configurations by the EDA tool for clustering the third element and the fourth element by the EDA tool to form the second structural cluster for the second selected critical path, the second plurality of configurations being generated based on a plurality of horizontal and vertical orientations of the third element relative to the fourth element, each configuration in the second plurality of configurations having a logic connection between the third element and the fourth element that maps to a dedicated point-to-point connection on the programmable logic integrated circuit; and clustering the first structural cluster and the second structural cluster by the EDA tool to form a third structural cluster.

* * * * *